(12) United States Patent
Isobe

(10) Patent No.: US 7,633,113 B2
(45) Date of Patent: Dec. 15, 2009

(54) SEMICONDUCTOR DEVICE AND MANUFACTURING METHOD OF SAME

(75) Inventor: Kazuaki Isobe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 175 days.

(21) Appl. No.: 11/738,739

(22) Filed: Apr. 23, 2007

(65) Prior Publication Data
US 2007/0252188 A1 Nov. 1, 2007

(30) Foreign Application Priority Data
Apr. 26, 2006 (JP) ............... 2006-122391

(51) Int. Cl.
*H01L 29/76* (2006.01)
(52) U.S. Cl. .............. 257/314; 257/315; 257/316; 438/257
(58) Field of Classification Search ......... 257/314–316, 257/E29.14, E29.161, E29.275, E29.319; 438/257
See application file for complete search history.

(56) References Cited

U.S. PATENT DOCUMENTS
6,555,427 B1 * 4/2003 Shimizu et al. ............. 438/238
2006/0234448 A1 * 10/2006 Yonehama et al. .......... 438/257

FOREIGN PATENT DOCUMENTS
JP 2001-94075 4/2001
JP 2004-48064 2/2004

OTHER PUBLICATIONS

K. Shimizu, et al., "A Novel High-Density $5F^2$ NAND STI Cell Technology Suitable for 256Mbit and 1Gbit Flash Memories", IEEE Tech. Dig. of IEDM, 1997, 4 pages.
Albert Fazio, "A 130nm Flash+Logic: Technology and Applications", IEEE Proc. NVSMW, 2003, pp. 12-14.
Wook Hyun Kwon, et al., "Highly Reliable 256Mb NOR Flash MLC with Self-Aligned Process and Controlled Edge Profile", Extended Abstracts of the 2005 International Conference on Solid State Devices and Materials, 2005, pp. 448-449.

* cited by examiner

*Primary Examiner*—Theresa T Doan
(74) *Attorney, Agent, or Firm*—Oblon, Spivak, McClelland, Maier & Neustadt, L.L.P.

(57) ABSTRACT

A semiconductor device in which a channel region of MOS transistor is provided not to include a non-flat active region end portion and a manufacturing method thereof is disclosed. According to one aspect, there is provided a semiconductor device comprising a semiconductor substrate, a device isolation separating active region, wherein at least a portion of the device isolation is provided in the semiconductor substrate, and a memory cell including a memory cell transistor that comprises a channel region separated by a slit and constituted of a flat active region alone, a charge storage layer provided on a gate dielectric on the channel region, and a first gate electrode provided on an inter-electrode dielectric so as to cover the charge storage layer, and a select transistor that comprises a second gate electrode provided on the gate dielectric on the active region and electrically connected to a wiring.

13 Claims, 6 Drawing Sheets

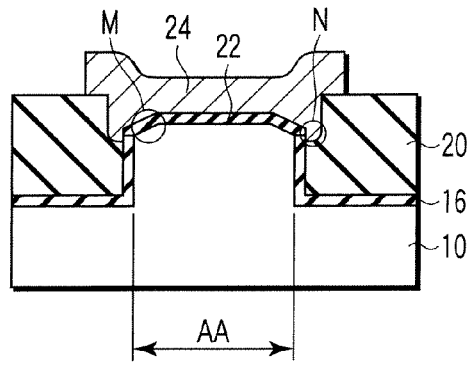
FIG. 1 (PRIOR ART)
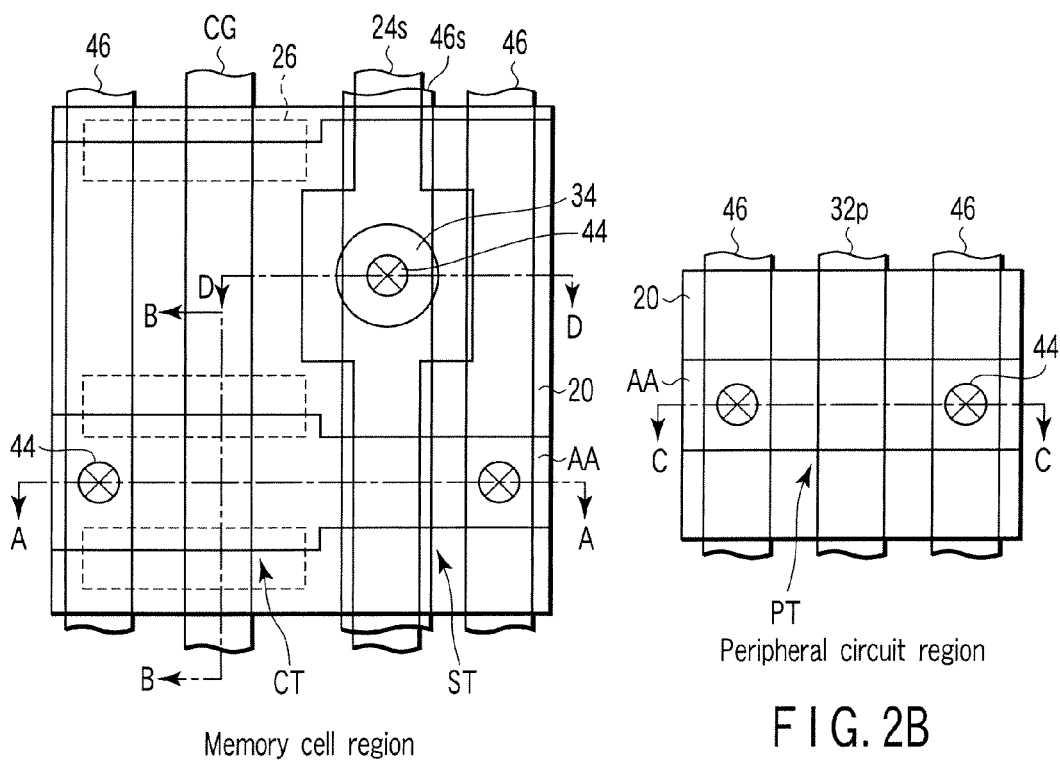
Memory cell region
FIG. 2A
FIG. 2B

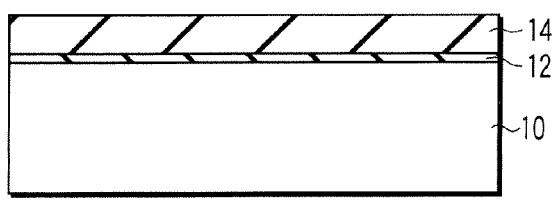
F I G. 4A
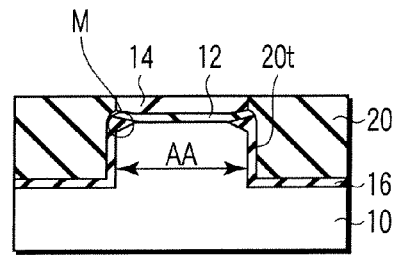
F I G. 4B
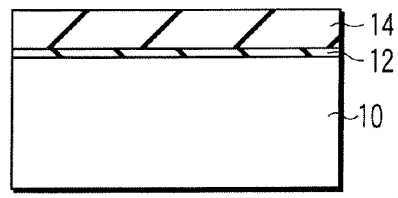
F I G. 4C
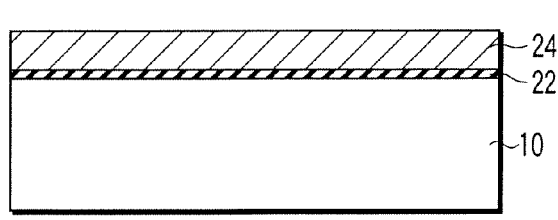
F I G. 5A
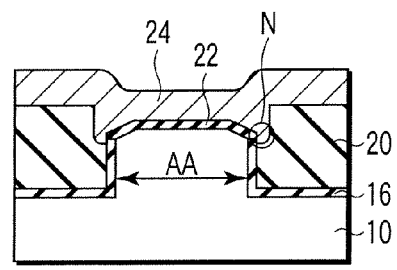
F I G. 5B
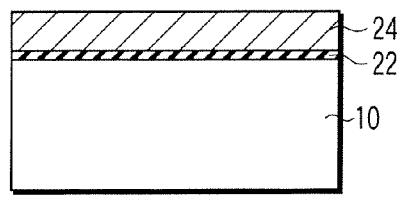
F I G. 5C

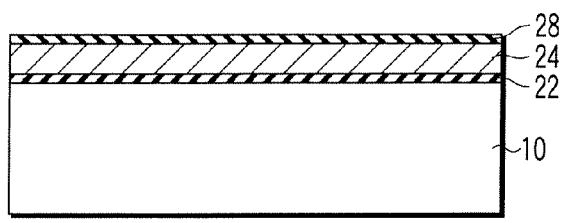
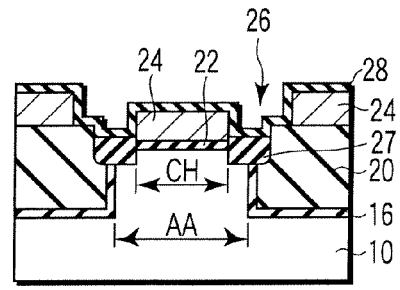
FIG. 6A     FIG. 6B
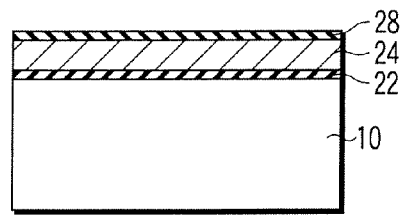
FIG. 6C
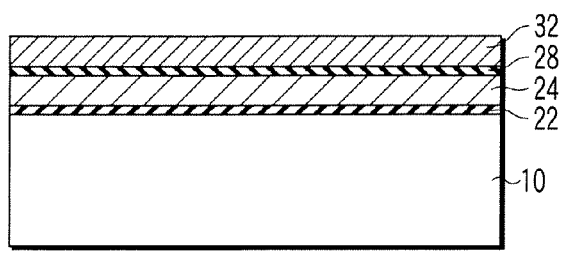
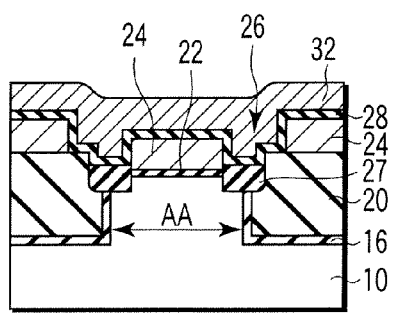
FIG. 7A     FIG. 7B
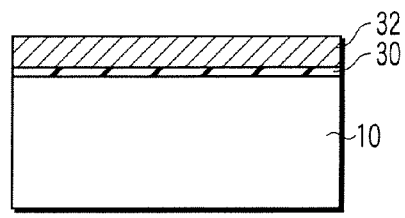
FIG. 7C

SEMICONDUCTOR DEVICE AND MANUFACTURING METHOD OF SAME

CROSS-REFERENCE TO RELATED APPLICATIONS

This application is based upon and claims the benefit of priority from prior Japanese Patent Application No. 2006-122391, filed Apr. 26, 2006, the entire contents of which are incorporated herein by reference.

BACKGROUND OF THE INVENTION

1. Field of the Invention

The present invention relates to a semiconductor device and a manufacturing method thereof, and in particular to a semiconductor device including a flat active region and a manufacturing method thereof.

2. Description of the Related Art

According to miniaturization of a semiconductor device, a semiconductor substrate surface shape with a miniaturized active region adversely affects characteristics of the semiconductor device.

The active region is separated by providing device isolation, for example, shallow trench isolation (STI), to a semiconductor substrate surface. After the device isolation is formed, a mask insulator used for forming the device isolation is removed. Due to formation of the device isolation and removal of the mask insulator, a non-flat portion is formed in the active region near a boundary between the device isolation and the active region. In a conventional semiconductor device, for example, a non-volatile semiconductor storage device having a floating gate electrode, a gate insulator (or a tunnel insulator) is formed on the active region having the non-flat surface, and the floating gate electrode is provided so as to cover the active region and touch the device isolation (i.e., see Jpn. Pat. Appln. KOKAI Publication No. 2004-48064).

The semiconductor device thus manufactured has a cross-sectional shape such as shown in W. H. Kwon; "Highly Reliable 256 Mb NOR Flash MLC with Self-Aligned Process and Controlled Edge Profile", Proc. SSDM 2005, Kobe, pp. 448-449. An example of a cross-sectional shape of the conventional non-volatile semiconductor device having an active region separated by STI is shown in FIG. 1. A semiconductor substrate 10 surface of an active region AA is not flat wholly, and it has sagging near both ends thereof such as a portion shown by M. Further, a side face portion of the STI 20 projecting above the semiconductor substrate 10 retreats due to etching and a width thereof becomes narrower than a portion in the semiconductor substrate 10, so that a portion thereof contacting with the semiconductor substrate 10 sinks as shown by N in FIG. 1. A floating gate electrode 24 is formed over the active region on a gate insulator 22. That is, the floating gate electrode 24 is formed so as to cover end portions of the non-flat active region. Therefore, the floating gate electrode 24 has a cross-sectional shape projecting downwardly that it fills in the sink of the STI 20 near the end portion of the active region AA. If a MOS transistor is formed in a region having such a shape, since a channel region is not flat, for example, such a problem that electric field concentrates to the end portion of the active region during programming data to the floating gate electrode 24 where a high electric field is applied and a programming characteristic dispersion occurs.

BRIEF SUMMARY OF THE INVENTION

According to one aspect of the present invention, there is provided a semiconductor device comprising: a semiconductor substrate; a device isolation separating active region of the semiconductor substrate, wherein at least a portion of the device isolation is provided in the semiconductor substrate; and a memory cell including a memory cell transistor and a select transistor provided on the active region, wherein the memory cell transistor comprises a channel region separated by a slit and constituted of a flat active region surface alone, wherein the slit is provided so as to include at least end portion of the active region, a charge storage layer provided on a gate dielectric on the channel region, and a first gate electrode provided on an inter-electrode dielectric so as to cover the charge storage layer, and wherein the select transistor comprises a second gate electrode provided on the gate dielectric on the active region and electrically connected to a wiring.

According to another aspect of the present invention, there is provided a manufacturing method of a semiconductor device comprising: forming a mask insulator on a silicon oxide film on a semiconductor substrate; patterning the mask insulator to a device isolation pattern; forming a device isolation trench in the semiconductor substrate using the patterned mask insulator as a mask; filling an isolation dielectric in the device isolation trench to form device isolation, thereby separating a silicon substrate surface to active regions; removing the mask insulator and the silicon oxide film to expose a surface of the active region; forming a gate dielectric on the active region; depositing a first conductive film on a whole surface of the gate dielectric; forming a slit in the first conductive film, the gate dielectric, and the semiconductor substrate so as to include at least end portion of the active region; forming an inter-electrode dielectric on a whole face of the first conductive film including an inner face of the slit; depositing a second conductive film on the inter-electrode dielectric; patterning the second conductive film, the inter-electrode dielectric, the first conductive film, and the gate dielectric to form a gate electrode of a memory cell transistor and a gate electrode of a select transistor; introducing dopant to the semiconductor substrate using the gate electrodes of the memory cell transistor and the select transistor as masks to form source/drain; forming a first wiring electrically connected to the source/drain; and forming a second wiring electrically connected to the first conductive film of the select transistor.

BRIEF DESCRIPTION OF THE SEVERAL VIEWS OF THE DRAWING

FIG. 1 is a diagram for explaining a cross-sectional shape of a non-volatile semiconductor storage device according to a prior art;

FIGS. 2A and 2B are plan views for explaining an example of a semiconductor storage device according to a first embodiment of the present invention;

FIGS. 4A to 4C are cross-sectional views for explaining an example of a manufacturing method of the semiconductor storage device according to the first embodiment;

FIGS. 5A to 5C are cross-sectional views for explaining an example of the manufacturing method of the semiconductor storage device continuing from FIGS. 4A to 4C;

FIGS. 6A to 6C are cross-sectional views for explaining an example of the manufacturing method of the semiconductor storage device continuing from FIGS. 5A to 5C;

FIGS. 7A to 7C are cross-sectional views for explaining an example of the manufacturing method of the semiconductor storage device continuing from FIGS. 6A to 6C;

DETAILED DESCRIPTION OF THE INVENTION

Figure 3A:
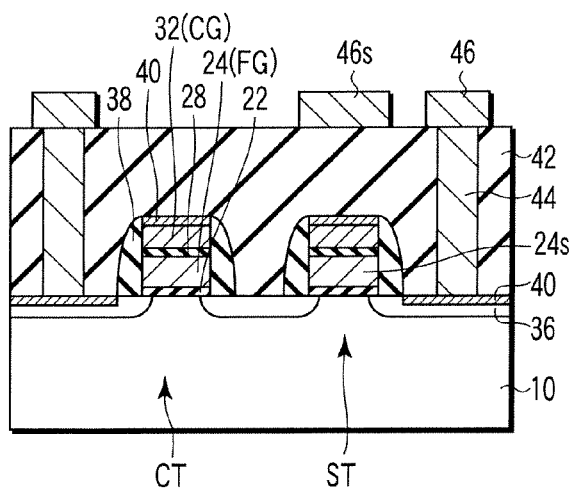
FIGS. 3A to 3D are cross-sectional views for explaining an example of a cross-sectional structure of the semiconductor storage device according to the first embodiment.

Embodiments of the present invention provide a semiconductor device in which a channel region of MOS transistor is provided not to include a non-flat active region end portion formed during a device isolation formation so as to suppress dispersion of characteristics of the semiconductor device due to a shape of the active region, and a manufacturing method thereof.

The present invention can be applied to, for example, a non-volatile storage device, such as flash memory or EEPROM, a semiconductor device embedding the non-volatile storage device and logic semiconductor device, and a manufacturing method thereof. Here, the embodiment of the present invention will be explained below in detail with regard to a semiconductor device including flash memory and peripheral circuit as an example with reference to the accompanying drawings. Throughout the drawings, corresponding portions are denoted by corresponding reference numerals. Each of the following embodiments is illustrated by way of example, however, the present invention can be variously modified and implemented without departing from the spirit of the present invention.

Figure 3B:
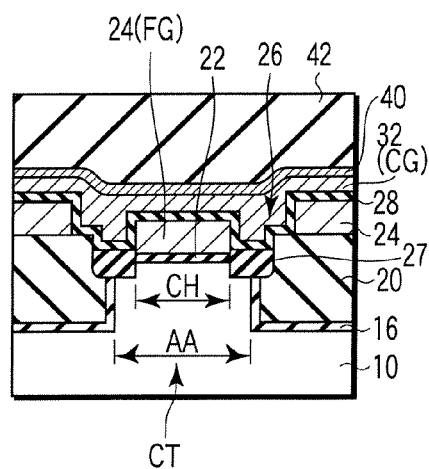
Figure 3C:
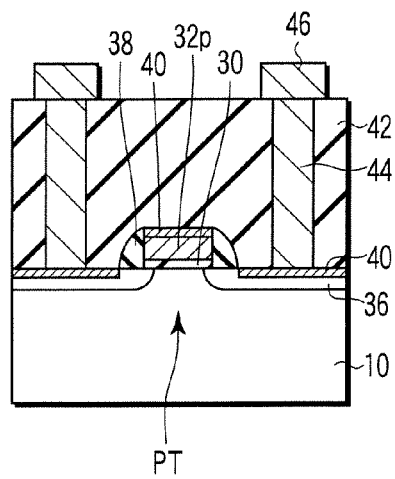
Figure 3D:
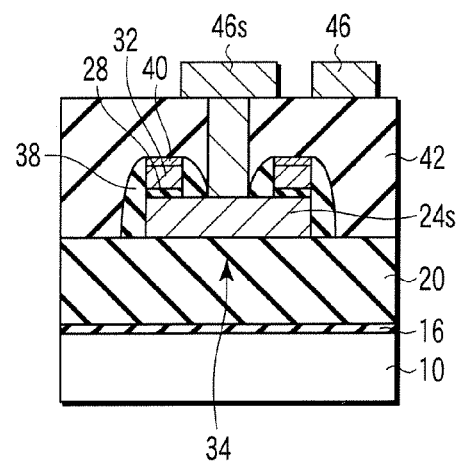

The semiconductor device according to this embodiment includes a memory cell region including a flash memory cell transistor CT (hereinafter, called a "cell transistor") and a select transistor ST as shown in FIG. 2A, and a peripheral circuit region configured to include a peripheral transistor PT as shown in FIG. 2B. An example of a cross-sectional structure of the semiconductor device according to this embodiment is shown in FIGS. 3A to 3D. FIG. 3A is a cross-sectional view including the cell transistor CT and the select transistor ST in a direction shown by section line A-A in FIG. 2A. FIG. 3B is a cross-sectional view of the cell transistor CT in a direction perpendicular to FIG. 3A shown by section line B-B in FIG. 2A. FIG. 3C is a cross-sectional view of the peripheral transistor PT along section line C-C in FIG. 2B. FIG. 3D is a cross-sectional view of a contact area 34 of the select transistor along section line D-D in FIG. 2A. In FIGS. 2A and 3A, a configuration where one cell transistor CT and one select transistor constitute one bit is shown for simplicity but a chain structure where a plurality of, such as 8 or 16, cell transistors are included between a pair of select transistors may be adopted.

As shown in FIG. 3A, the cell transistor CT has a two-layer gate electrode structure including a floating electrode gate 24 and a control gate electrode 32. The select transistor ST operates to select a specific cell transistor CT. As shown in FIG. 3A, the select transistor ST has a two-layer gate electrode structure 24 and 32 like the cell transistor CT, but a potential is directly applied to a gate electrode 24s in the first layer. As shown in FIG. 3C, the peripheral transistor PT has a one-layer gate electrode structure 32p. As shown in FIG. 3B, in the active region AA, a non-flat end portion formed during device isolation 20 formation is not included in a channel region CH of the cell transistor CT in a channel width direction thereof.

Thus, characteristic dispersion of the cell transistor CT can be suppressed by forming the cell transistor CT in such a manner.

Next, an example of a manufacturing method of the semiconductor device according to this embodiment will be explained with reference to cross-sectional views shown in FIGS. 4A to 4D through FIGS. 10A to 10D. FIGS. A, B, and C in respective figures are a cross-sectional view including a cell transistor CT and a select transistor ST in a direction along section line A-A shown in FIG. 2A, a cross-sectional view of a cell transistor CT in a direction perpendicular to each FIG. A along section line B-B shown in FIG. 2A, and a cross-sectional view of the peripheral transistor PT along section line C-C shown in FIG. 2B, like the cross-sectional views shown in FIGS. 3A, 3B, and 3C, respectively.

(1) Referring to FIGS. 4A to 4C, a device isolation 20 is formed in a semiconductor substrate 10, for example, a silicon substrate.

First, a first silicon oxide film ($SiO_2$ film) 12 is formed on a whole surface of the semiconductor substrate 10, for example, by thermal oxidation. A silicon nitride film ($Si_3N_4$ film) 14 is formed on the first $SiO_2$ film 12. The $Si_3N_4$ film 14 serves as a mask insulator for forming the device isolation 20, and a pattern of an active region AA, namely, a negative pattern of the device isolation 20 is formed by lithography and etching therein. A trench 20t for device isolation is formed in the semiconductor substrate 10 using the $Si_3N_4$ film 14 as a mask by anisotropic etching, for example, reactive ion etching (RIE). A second $SiO_2$ film 16 is formed on the device isolation trench 20t surface, for example, by thermal oxidation in order to remove etching damage on the device isolation trench 20t surface, if needed. In this process, as shown in FIG. 4B, the silicon oxide 16 grows laterally under the $Si_3N_4$ film 14, thereby forming a so-called "bird's beak" at an end portion of the active region AA, and sagging (M) occurs in the end portion of the semiconductor substrate 10 surface in the active region AA.

Thereafter, a device isolation dielectric 20, for example, an $SiO_2$ film formed by chemical vapor deposition (CVD), is deposited thickly on the whole surface of the semiconductor substrate 10 including the inside of the device isolation trench 20t, and then the $SiO_2$ film is planarized by chemical mechanical polishing (CMP) using the $Si_3N_4$ film 14 as a stopper, for example.

Thus, the device isolation 20 shown in FIG. 4B can be formed.

(2) Next, referring to FIGS. 5A to 5C, a first gate dielectric 22 and a floating gate electrode 24 are formed on the active region AA of the semiconductor substrate 10.

The $Si_3N_4$ film 14 and the first $SiO_2$ film 12 used as the masks for forming the device isolation 20 are removed, for example, by wet etching. At this etching time, the device isolation dielectric 20 retreats so that a sink (N) occurs at a portion thereof adjacent to the active region AA, as shown in FIG. 5B.

After the $Si_3N_4$ film 14 and the first $SiO_2$ film 12 are removed, though not shown in the figure, dopant, for example, boron (B), is ion-implanted such that threshold voltages of the cell transistor CT, the select transistor ST, and the peripheral transistor PT to be formed on the active region AA to be adjusted to desired values. The first gate dielectric 22, for example, an $SiO_2$ film formed by thermal oxidation, is formed on the active region AA of the semiconductor substrate 10. A first conductive film 24 is deposited on a whole surface of the first gate dielectric 22. The first conductive film 24 is to be patterned to a first gate electrode, namely, a floating gate electrode FG, of the cell transistor CT in a latter step. As the first conductive film 24, for example, polysilicon deposited by CVD can be used. Dopant, for example, phosphorus (P) is introduced into the polysilicon to reduce resistance.

Thus, the first conductive film 24 is formed on a structure where a portion of the device isolation 20 has retreated as shown in FIGS. 5A to 5C.

(3) Next, referring to FIGS. 6A to 6C, slits 26 for making a channel region of the cell transistor CT to be flat are provided and an inter-electrode dielectric (hereinafter, called an "interpoly dielectric") 28 is formed over a whole surface of the semiconductor substrate 10.

In order to divide the first conductive film 24 within the memory cell region to respective memory cells, for example, a slit mask pattern is formed by lithography in a photoresist film (not shown) provided on the first conductive film 24. Then, slits 26 are formed by removing the first conductive film 24, the first gate dielectric 22, and the semiconductor substrate 10, for example, by anisotropic etching, such as RIE, using the photoresist film as a mask. As shown in FIG. 6B, the slit 26 is formed such that at least a portion thereof is positioned within the active region AA to include the end portion thereof. The sagged surface at the end portion of the active region AA is also etched by the etching for forming the slits 26, so that only a flat surface of the active region AA is left as the channel region CH of the cell transistor CT. A shape of the slit 26 may be formed in, for example, a slender rectangular shape or a slender hall shape in order to separate a plurality of cell transistors CT simultaneously. Thereafter, the photoresist is removed.

Then, according to need, an oxide film 27, for example, a tetraethylorthosilicate (TEOS) film is formed on a whole surface of the slit 26 and anisotropic etching, for example, RIE is performed to a whole surface of the oxide film 27, so that the oxide film 27 can be remained on a bottom in the slit 26. At this time, the film thickness of the oxide film 27 preferably is at least three times thicker than that of the gate dielectric 22, and the oxide film 27 is formed such that an upper face level thereof is higher than that of the gate dielectric 22.

Next, an interpoly dielectric 28 is formed on a whole surface including the inside of the slit 26. As the interpoly dielectric 28, for example, a so-called "ONO film" with a stacked structure comprising an $SiO_2$ film, an $Si_3N_4$ film, and an $SiO_2$ film can be used.

Thus, a flat channel region CH of the cell transistor CT can be formed as shown in FIG. 6B.

(4) Next, referring to FIGS. 7A to 7C, in a peripheral circuit region, the semiconductor substrate 10 is exposed, then a second gate dielectric 30 and a second conductive film 32 are formed on a whole surface of the semiconductor substrate 10.

Specifically, a photoresist (not shown) is formed so as to cover a region of the semiconductor substrate 10 other than the peripheral circuit region. The interpoly dielectric 28 in the peripheral circuit region is removed, for example, by RIE using the photoresist as a mask, and the first conductive film 24 is removed by isotropic etching, for example, chemical dry etching (CDE). The surface of the semiconductor substrate 10 is exposed by wet-etching the first gate dielectric 22, for example, using ammonium fluoride ($NH_4F$) or the like.

After the photoresist used as the mask for etching is removed, a second gate dielectric 30 is formed on the surface of the semiconductor substrate 10 in the peripheral circuit region, for example, by thermal oxidation. A second conductive film 32 is deposited on whole surface of the memory cell region and the peripheral circuit region. As the second conductive film 32, for example, polysilicon deposited by CVD and doped with phosphorus (P) can be used like the first conductive film 24.

Thus, the memory cell region with the two-layer conductive film structure and the peripheral circuit region with the one-layer conductive film structure can be formed as shown in FIGS. 7A to 7C.

Figure 8A:
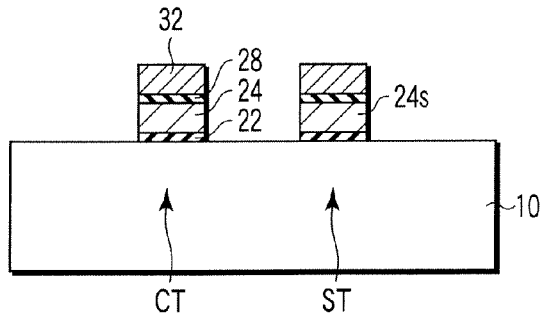
FIGS. 8A to 8D are cross-sectional views for explaining an example of the manufacturing method of the semiconductor storage device continuing from FIGS. 7A to 7C.
Figure 8B:
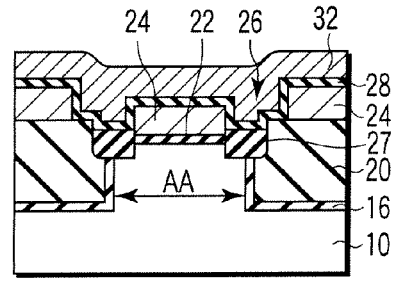
Figure 8C:
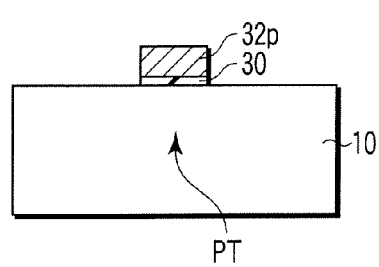
Figure 8D:
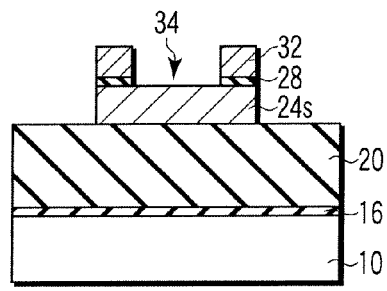

(5) Next, referring to FIGS. 8A to 8D, a gate electrode of each transistor is patterned, and a contact area of the select transistor is formed. FIG. 8D is a cross-sectional view of the contact area 34 of the select transistor along section line D-D shown in FIG. 2A.

In the memory cell region, a photoresist pattern (not shown) of gate electrodes 32 of the cell transistor CT and the select transistor ST is formed by lithography. At this time, the peripheral circuit region is covered with the photoresist in advance. The second conductive film 32, the interpoly dielectric 28, and the first conductive film 24 in the memory cell region are anisotropically etched, for example, by RIE using the photoresist as a mask, so that gate electrodes 32 of the cell transistor CT and the select transistor ST are formed as shown in FIG. 8A. A two-layer gate electrode, that is, a first gate electrode 24 made from the first conductive film 24 and the second gate electrode 32 made from the second conductive film 32, is formed. The first gate electrode 24 for the cell transistor CT functions as a floating gate electrode FG and the second gate electrode 32 functions as a control gate electrode CG.

Next, the memory cell region is covered with a photoresist, and the second conductive film 32 in the periphery circuit region is removed by anisotropic etching, thereby forming a gate electrode 32p of the peripheral transistor PT, in the same manner described above.

At the etching time, a contact area 34 of the select transistor ST is formed by removing the second conductive film 32. Then the interpoly dielectric 28 on a bottom face of the contact area 34 is removed. This process is performed for directly applying a potential to the first gate electrode 24s of the select transistor ST.

Thus, as shown in FIGS. 8A to 8D, the gate electrode of each of transistors CT, ST, and PT, and the contact area 34 of the select transistor ST can be formed.

Figure 9A:
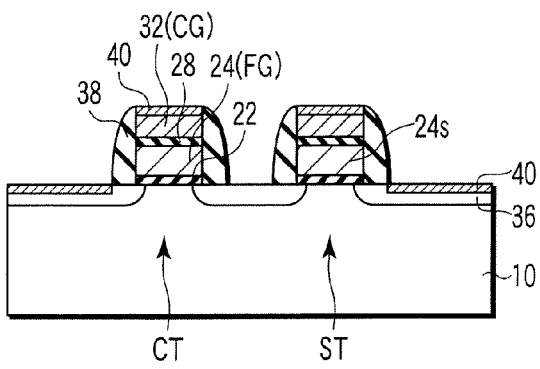
FIGS. 9A to 9C are cross-sectional views for explaining an example of the manufacturing method of the semiconductor storage device continuing from FIGS. 8A to 8D.
Figure 9B:
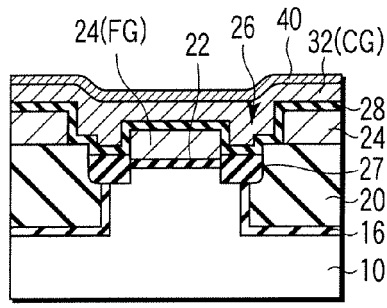
Figure 9C:
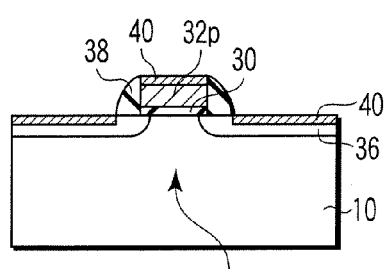
Figure 10A:
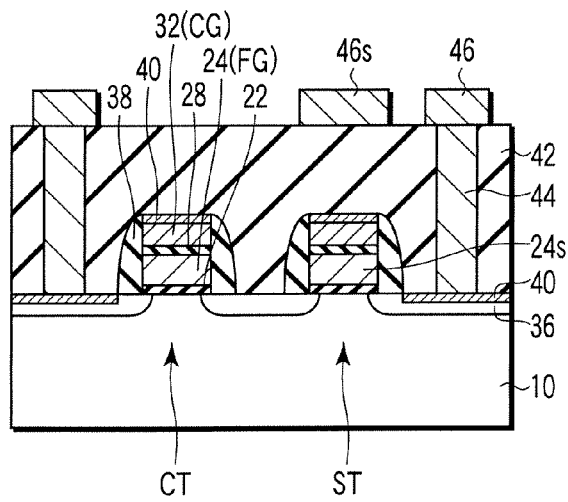
FIGS. 10A to 10D are cross-sectional views for explaining an example of the manufacturing method of the semiconductor storage device continuing from FIGS. 9A to 9C.
Figure 10B:
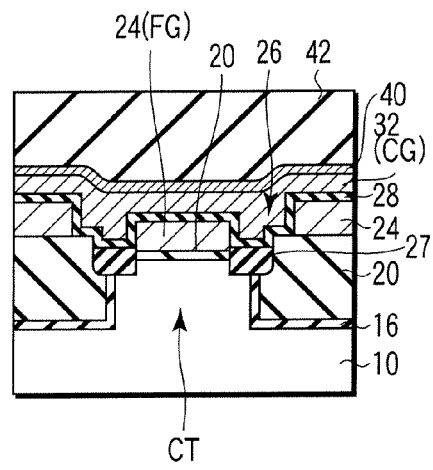
Figure 10C:
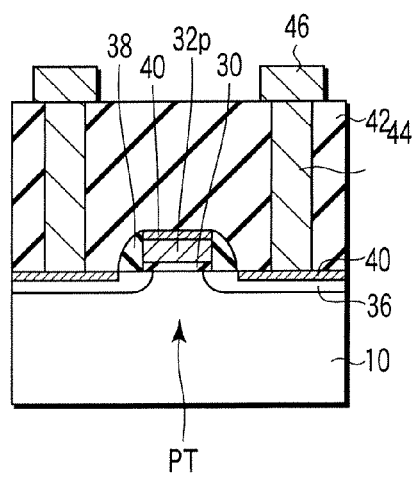
Figure 10D:
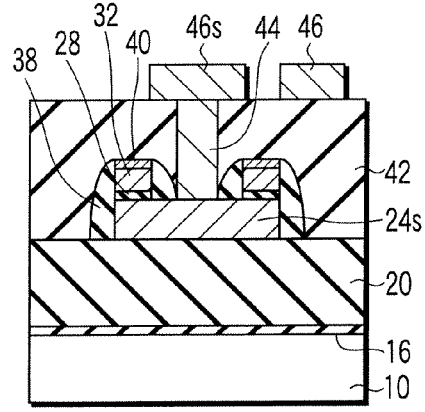

(6) Next, referring to FIGS. 9A to 9C, dopant, for example, arsenic (As) is ion-implanted into the semiconductor substrate 10 using the gate electrodes of the cell transistor CT and the select transistor ST in the memory cell region and the peripheral transistor PT in the peripheral circuit region as masks so that source/drain 36 is formed. An insulator 38, for example, an $Si_3N_4$ film is deposited on a whole surface of the semiconductor substrate 10 by CVD and anisotropic etching is performed, for example, by RIE, so that a side wall spacer 38 is formed on side faces of each gate electrode.

Next, a metal film (not shown) for silicide, for example, cobalt (Co), is deposited on a whole surface of the semiconductor substrate 10, and first annealing is performed. During the annealing, silicidation reaction occurs on an upper face of the gate electrode 32 and a surface of the source/drain 36 where the metal film and silicon come in contact with each other, so that silicide 40 is formed. After an unreacted metal film is removed, second annealing is performed at a temperature higher than that in the first annealing to reduce resistance of the silicide 40.

Thus, each transistor is formed as shown in FIGS. 9A to 9C.

(7) Next, referring to FIGS. 10A to 10D, a whole surface of the semiconductor substrate 10 is covered with an interlayer dielectric 42 and planarization is performed, for example, by CMP. As the interlayer dielectric 42, for example, boron-doped phosphor silicate glass (BPSG) or phosphor silicate glass (PSG) can be used. A contact hole reaching the silicide 40 of the source/drain 36 of each of the cell transistor CT, the select transistor ST, and the peripheral transistor PT is formed in the interlayer dielectric 42. Simultaneously therewith, a contact hole reaching the second conductive film 24s at the contact area 34 of the select transistor ST formed in step (5) is formed in the interlayer dielectric 42. For example, tungsten (W) is deposited by CVD on a whole surface of the interlayer dielectric 42 including the inside of the contact hole. The tungsten deposited on the surface is removed, for example, by CMP so that a contact plug 44 is formed in the interlayer dielectric 42.

Next, metal for wiring 46, for example, aluminum (Al), is deposited on a whole surface of the interlayer dielectric 42 by sputtering, and patterning is performed by lithography and etching, so that wirings 46 connected to the contact plugs 44 are formed. Wirings 46s connected to the first gate electrodes 24s of the select transistors ST are provided in parallel with the first gate electrode 24s for every several cells in a memory cell array, so that resistance of the wiring can be reduced.

Thus, a structure of the semiconductor device according to this embodiment shown in FIGS. 10A to 10D can be formed.

Further, the semiconductor device of the embodiment is completed by performing processes required for a semiconductor device, such as multilayer wiring.

According to the embodiment explained above, a semiconductor device where a non-flat active region end portion formed during a formation of device isolation is not contained in a channel region of a cell transistor and a manufacturing method thereof are provided. Thereby, it can be suppressed dispersion of characteristics of a semiconductor device due to a shape of the channel region. Especially, dispersion of programming characteristic of a non-volatile semiconductor storage device where high electric field is applied to a gate dielectric is suppressed so that a Vth distribution in programming can be narrowed, for example.

The present invention is not limited to the above embodiment and it can be implemented in variously modified aspects.

Figure 11:
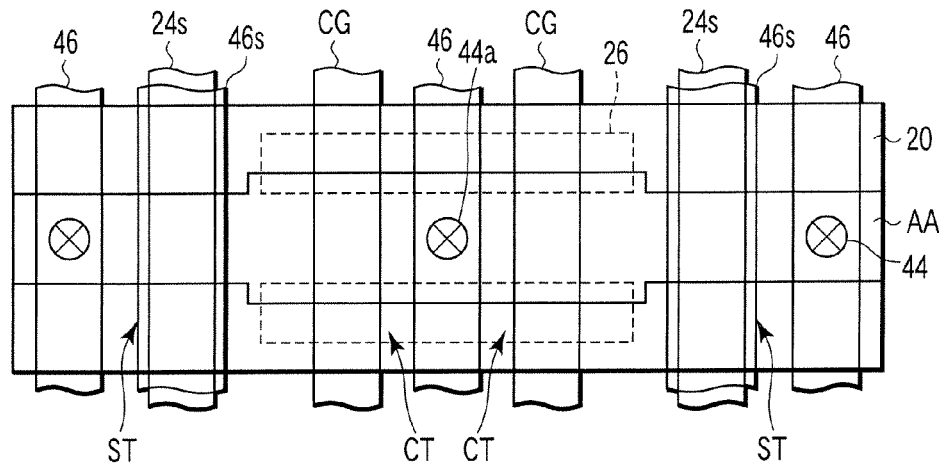
FIG. 11 is a diagram for explaining a modification of the present invention.

The above embodiment shows the case that one cell transistor is separated by a pair of slits but modification can be conducted such that a plurality of cell transistors is simultaneously separated by a pair of slits. As one example, a case that two cell transistors are separated by a pair of slits is shown in FIG. 11. In this modification, one bit comprises one cell transistor CT and one select transistor ST like the above. Two bits are symmetrically arranged so as to share a contact 44a in the cell transistor CT side and that two cell transistors CT are separated by a pair of slits 26.

In the embodiment described above, the case that the peripheral circuit comprises one kind of a peripheral transistor, but modification can be made such that the peripheral circuit comprises at least two kinds of the peripheral transistors including a high voltage transistor and a low voltage transistor.

As explained above, in the above embodiment, the semiconductor device including a flash memory has been explained as an example, but the present invention can be also applied to EEPROM including a floating gate electrode and control gate electrode like the flash memory, and a non-volatile memory device such as MONOS type EEPROM that uses a dielectric film as a charge storage layer instead of the floating gate electrode. Further, the present invention can be applied to a semiconductor device where these non-volatile storage devices are embedded.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate;
   a device isolation separating active region of the semiconductor substrate, wherein at least a portion of the device isolation is provided in the semiconductor substrate; and
   a memory cell including a memory cell transistor and a select transistor provided on the active region, wherein
   the memory cell transistor comprises
   a channel region separated by a slit and constituted of a flat active region surface alone, wherein the slit is provided so as to include at least end portion of the active region to reduce a width of the active region to a width less than a distance between the device isolations,
   a charge storage layer provided on a gate dielectric on the channel region, and
   a first gate electrode provided on an inter-electrode dielectric so as to cover the charge storage layer, and wherein
   the select transistor comprises
   a second gate electrode provided on the gate dielectric on the active region and electrically connected to a wiring.

2. The semiconductor device according to claim 1, further comprising:
   a peripheral circuit comprising a peripheral transistor including a third gate electrode provided on a second gate dielectric on the active region.

3. The semiconductor device according to claim 2, wherein the first gate electrode and the third gate electrode are simultaneously formed.

4. The semiconductor device according to claim 1, wherein the charge storage layer is a floating gate electrode.

5. The semiconductor device according to claim 4, wherein the select transistor further comprises a fourth gate electrode prodded on an inter-electrode dielectric on to second gate electrode.

6. The semiconductor device according to claim 5, wherein the floating gate electrode and the second gate electrode are simultaneously formed, and the first gate electrode and to fourth gate electrode are simultaneously formed.

7. The semiconductor device according to claim 1, wherein the charge storage layer is a dielectric film.

8. The semiconductor device according to claim 1, wherein the select transistor further comprises a fourth gate electrode formed on an inter-electrode dielectric on the second gate electrode.

9. The semiconductor device according to claim 1, wherein a single slit simultaneously separates channel regions of a plurality of memory coil transistors.

10. The semiconductor device according to claim 1, wherein a plurality of memory cell transistors are disposed between a pair of the select transistors.

11. The semiconductor device according to claim 10, wherein a single slit simultaneously separates channel regions of the plurality of memory cell transistors.

12. The semiconductor device according to claim 1, wherein one memory cell transistor and one select transistor configure one bit and two bits are arranged plane-symmetrically in a channel direction of the memory cell transistor.

13. The semiconductor device according to claim 1, further comprising a silicon oxide film provided on a bottom of the slit and having a thickness that is at least three times that of the gate dielectric, wherein an upper face of the silicon oxide film is higher than that of the gate dielectric.

* * * * *